United States Patent
Flachowsky et al.

(10) Patent No.: US 8,698,243 B2
(45) Date of Patent: Apr. 15, 2014

(54) SEMICONDUCTOR DEVICE WITH STRAIN-INDUCING REGIONS AND METHOD THEREOF

(71) Applicants: Stefan Flachowsky, Dresden (DE); Jan Hoentschel, Dresden (DE); Thilo Scheiper, Dresden (DE)

(72) Inventors: Stefan Flachowsky, Dresden (DE); Jan Hoentschel, Dresden (DE); Thilo Scheiper, Dresden (DE)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 0 days.

(21) Appl. No.: 13/953,349

(22) Filed: Jul. 29, 2013

(65) Prior Publication Data
US 2013/0313572 A1 Nov. 28, 2013

Related U.S. Application Data

(62) Division of application No. 13/345,457, filed on Jan. 6, 2012, now Pat. No. 8,524,563.

(51) Int. Cl.
*H01L 21/8242* (2006.01)
*H01L 21/336* (2006.01)

(52) U.S. Cl.
USPC ........... 257/346; 257/135; 257/282; 257/335; 257/401; 257/E21.427; 438/286

(58) Field of Classification Search
None
See application file for complete search history.

(56) References Cited

U.S. PATENT DOCUMENTS

| 2004/0121536 A1 | 6/2004 | Hung et al. |
| 2010/0078689 A1 | 4/2010 | Kronholz et al. |
| 2012/0135576 A1* | 5/2012 | Lee et al. ............ 438/299 |

OTHER PUBLICATIONS

U.S. Office Action mailed Dec. 24, 2012 in U.S. Appl. No. 13/345,457.

* cited by examiner

*Primary Examiner* — Zandra Smith
*Assistant Examiner* — Pamela E Perkins
(74) *Attorney, Agent, or Firm* — Ingrassia Fisher & Lorenz, P.C.

(57) ABSTRACT

Improved MOSFET devices are obtained by incorporating strain inducing source-drain regions whose closest facing "nose" portions underlying the gate are located at different depths from the device surface. In a preferred embodiment, the spaced-apart source-drain regions may laterally overlap. This close proximity increases the favorable impact of the strain inducing source-drain regions on the carrier mobility in an induced channel region between the source and drain. The source-drain regions are formed by epitaxially refilling asymmetric cavities etched from both sides of the gate. Cavity asymmetry is obtained by forming an initial cavity proximate only one sidewall of the gate and then etching the final spaced-apart source-drain cavities proximate both sidewalls of the gate along predetermined crystallographic directions. The finished cavities having different depths and nose regions at different heights extending toward each other under the gate, are epitaxially refilled with the strain inducing semiconductor material for the source-drain regions.

6 Claims, 7 Drawing Sheets

SEMICONDUCTOR DEVICE WITH STRAIN-INDUCING REGIONS AND METHOD THEREOF

CROSS-REFERENCE TO RELATED APPLICATIONS

This application is a divisional application of U.S. patent application Ser. No. 13/345,457 filed Jan. 6, 2012, which is hereby incorporated in its entirety by reference.

FIELD OF THE INVENTION

This invention relates generally to structures and methods for forming semiconductor devices, especially field effect transistors (FETs) having strain inducing regions.

BACKGROUND OF THE INVENTION

It is known that introduction of strain in semiconductor devices can enhance carrier mobility and therefore enhance drive current capability of such devices. For example, and not intended to be limiting, with silicon semiconductor based metal-oxide-semiconductor (MOS) field effect transistors (FETs) it is known that use of source-drain regions formed of a silicon-germanium (Si—Ge) alloy or mixture can provide compressive strain in the channel region located between the source and drain of PMOS devices. This strain can increase carrier mobility in the channel region and significantly improve overall device properties. However, many practical difficulties are encountered in implementing such structures. For example, and not intended to be limiting, bringing the strain inducing source-drain regions closer to the gate edges in order to enhance the localized strain beneath the gate often leads to integrity problems with the gate dielectric and reduced manufacturing yield. For these and other reasons there is an ongoing need for improved structures and methods for strain enhanced semiconductor devices, especially MOS-FETs.

BRIEF SUMMARY OF THE INVENTION

Improved MOSFET devices (60) are obtained by incorporating strain inducing source-drain regions (62, 64) whose closest facing "nose" portions (621, 641) underlying the gate (28) are located at different depths (622, 642) from the device surface (25). In a preferred embodiment, the spaced-apart source-drain regions (62, 64) may laterally overlap (43). This close proximity increases the favorable impact of the strain inducing source-drain regions (62, 64) on the carrier mobility in a channel region (49) between the source and drain (62, 64). The source-drain regions (62, 64) are desirably formed by epitaxially refilling asymmetric cavities (62', 64') etched from both sidewalls (271', 272') of the gate (28). Cavity asymmetry is obtained by forming an initial cavity (74) proximate only one sidewall (272') of the gate (28) and then etching the final spaced-apart source-drain cavities (62', 64') proximate both sidewalls (271', 272') of the gate (28) along predetermined crystallographic directions. The finished cavities (62', 64') having different depths (625', 645') and nose regions (621', 641') at different heights extending toward each other under the gate (28), are epitaxially refilled with the strain inducing semiconductor material for the source-drain regions (62, 64).

BRIEF DESCRIPTION OF THE DRAWINGS

The invention will be better understood from a reading of the following detailed description, taken in conjunction with the accompanying figures in the drawings in which like numerals denote like or analogous elements, and wherein.

DETAILED DESCRIPTION OF THE INVENTION

Figure 1:
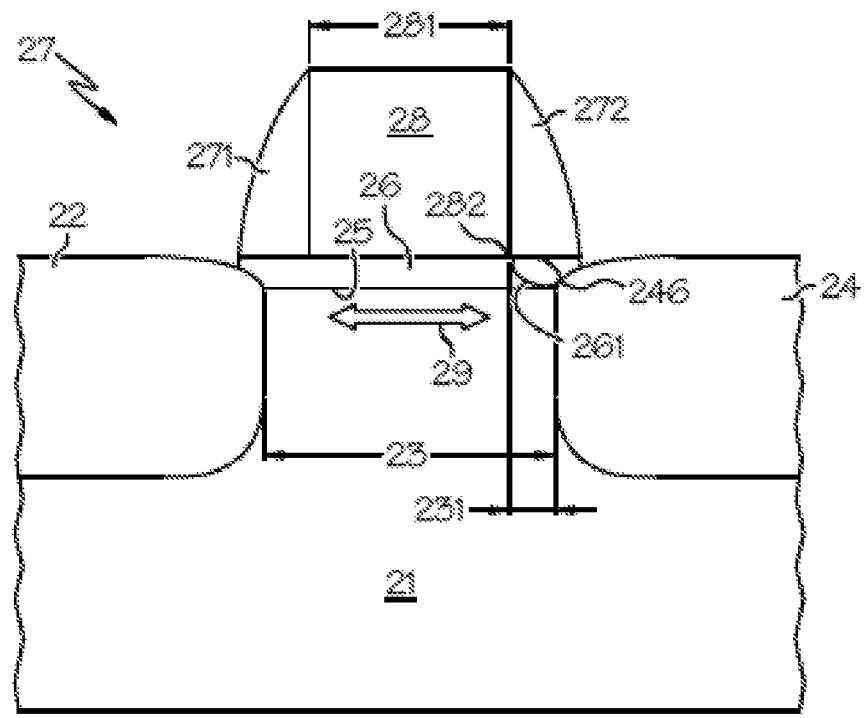
FIG. 1 shows a simplified cross-sectional view of a MOSFET employing strain inducing source-drain regions, according to the prior art.

The following detailed description is merely exemplary in nature and is not intended to limit the invention or the application and uses of the invention. Furthermore, there is no intention to be bound by any expressed or implied theory presented in the preceding technical field, background, or the following detailed description. For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "comprise," "include," "have" and any variations thereof, are intended to cover non-exclusive inclusions, such that a process, method, article, or apparatus that "comprises" or "includes" a list of elements or steps is not necessarily limited to those elements or steps, but may include other elements or steps not expressly listed or inherent to such process, method, article, or apparatus. As used herein the terms "substantial" and "substantially" mean sufficient to accomplish the stated purpose in a practical manner and that minor imperfections, if any, are not significant for the stated purpose. Furthermore, the terms "first," "second," "third," and the like in the description and the claims, if any, may be used for distinguishing between somewhat similar elements and not necessarily for describing a particular spatial arrangement or sequence or chronological order. It is to be understood that the terms so used are interchangeable under appropriate circumstances such that the embodiments of the invention described herein are, for example, capable of operation or construction in sequences, orientations and arrangements other than those illustrated or otherwise described herein.

Metal-oxide-semiconductor (MOS) devices are a well known form of field effect transistors (FETs). Complimentary metal-oxide-semiconductor (CMOS) devices, that is, with both P-channel (PMOS) and N-channel (NMOS) devices, are much used in integrated circuits (ICs). The term metal-oxide-semiconductor (MOS) and the abbreviation MOS are widely used in the art to refer to insulated gate field effect transistors or devices (IGFETs) irrespective of whether they employ metals or some other form of conductor for the gates of such devices, and irrespective of whether they use oxide or some other form of dielectric for the gate insulator. Doped semiconductors, metals, metal-semiconductor alloys, and semi-metals are non-limiting examples of suitable gate conductors. Oxides, nitrides, fluorides, combinations thereof and other inorganic and organic dielectrics are non-limiting examples of suitable gate insulators. Accordingly, the term metal-oxide-semiconductor and the abbreviations MOS, MOSFET, PMOS, NMOS and CMOS as used herein are intended to refer broadly to such insulated gate field effect transistors or devices and not be limited merely to those employing just metals and/or just oxides.

For convenience of explanation, embodiments of the invention are described herein for MOSFETs employing silicon semiconductors and, by way of example and not limitation, Si—Ge and/or Si—C strain inducing materials. However, persons of skill in the art will understand that such embodiments are not limited merely to silicon (Si) semiconductors (SC) and Si—Ge strain inducing inclusions for PMOS devices and/or Si—C strain inducing inclusions for NMOS devices, but also apply to other semiconductor materials and other strain inducing materials and other types of SC devices where introduction of strain inducing regions can improve overall device properties. Further, as used herein, the term "semiconductor", singular or plural, is intended to include any kind of semiconductor material, including but not limited to single crystal semiconductors, polycrystalline semiconductors, amorphous semiconductors as well as organic and inorganic semiconductors. As used herein, the term "substrate", singular or plural is intended to include bulk semiconductor substrates, insulating substrates, and combinations thereof, such as but not intended to be limiting, semiconductor-on-insulator (SOI) substrates and insulator-on-semiconductor (IOS) substrates. Substrates may be single crystal, polycrystalline, amorphous, laminated or combinations thereof. For convenience of description, various conductors may be referred to as "metals", but unless indicated otherwise by the particular context, the words "metal" and "conductor", singular or plural, should be interpreted broadly to include any type of electrical conductor, whether metallic or not. Semiconductors, doped semiconductors, metals, semi-metals, metal alloys, semiconductor-metal alloys and combinations thereof are non-limiting examples of useful electrical conductors. The abbreviation "SC" is used herein for the terms "semiconductor" and "semiconductor material".

In the drawings that follow, the width of the gate sidewalls and the lateral spacing between the gate edges above the gate insulator and the source-drain edges below the gate insulator have been exaggerated in order to avoid cluttering the drawings and to more clearly illustrate the invention. Persons of skill in the art will understand that in practice, such lateral (e.g., horizontal) spacing between gate edges and source-drain edges is minimized or substantially closed by lateral out-diffusion of the source and drain or even by a separate angled implant (not shown) to insure that a continuous conductive channel can be induced by the gate in the substrate between the source and drain. The amount of lateral out-diffusion of the source and drain is adjusted by varying the thermal budget during the fabrication process. This is well understood in the art.

FIG. 1 shows a simplified cross-sectional view of MOSFET 20 employing strain inducing source-drain regions 22, 24, according to the prior art. MOSFET 20 includes substrate 21 (e.g., of silicon) having upper surface 25. Strain inducing source region 22 and drain region 24 (e.g. of Si—Ge and/or Si—C) spaced apart by distance 23, have been formed in substrate 21 extending substantially to surface 25. Overlying surface 25 of substrate 21 between source 22 and drain 24 is gate insulator or dielectric 26 (e.g., of silicon oxide). Overlying gate insulator 26 is conductive gate 28 of lateral width 281. Dielectric sidewall regions 271, 272 (collectively 27) are provided on lateral edges of gate 28. When gate 28 is appropriately biased with respect to source region 22 and drain region 24, conductive channel region 29 is induced between source region 22 and drain region 24. For a PMOS device, substrate 21 is N-type and source-drain regions 22, 24 are P-type and channel region 29 embodies conduction by holes. For an NMOS device, substrate 21 is P-type and source-drain regions 22, 24 are N-type and channel region 29 embodies conduction by electrons. For silicon substrates, Si—Ge is a suitable strain inducing material for PMOS devices and Si—C is a suitable strain inducing material for NMOS devices.

The use of Si—Ge and/or Si—C source-drain regions 22, 24 in device 20 induces significant stain in channel region 29. In PMOS devices using Si—Ge, hole mobility is substantially increased in channel region 29, thereby providing improved current drive capability. An analogous effect occurs in NMOS devices incorporating Si—C source-drain regions. The magnitude of the strain induced in channel region 29 increases as source-drain separation 23 decreases. However, as separation 23 is made smaller, spacing 231 between gate edge 282 and drain edge 246 also decreases. The electric field in portion 261 of gate dielectric 26 between gate edge 282 and drain edge 246 also increases, which can lead to gate integrity problems as source-drain separation 23 is made smaller. This decreases the gate to drain breakdown voltage and can result in poor manufacturing yields. Thus, the strain induced channel mobility enhancement that can be realized with the structure of MOSFET 20 is limited.

Figure 2:
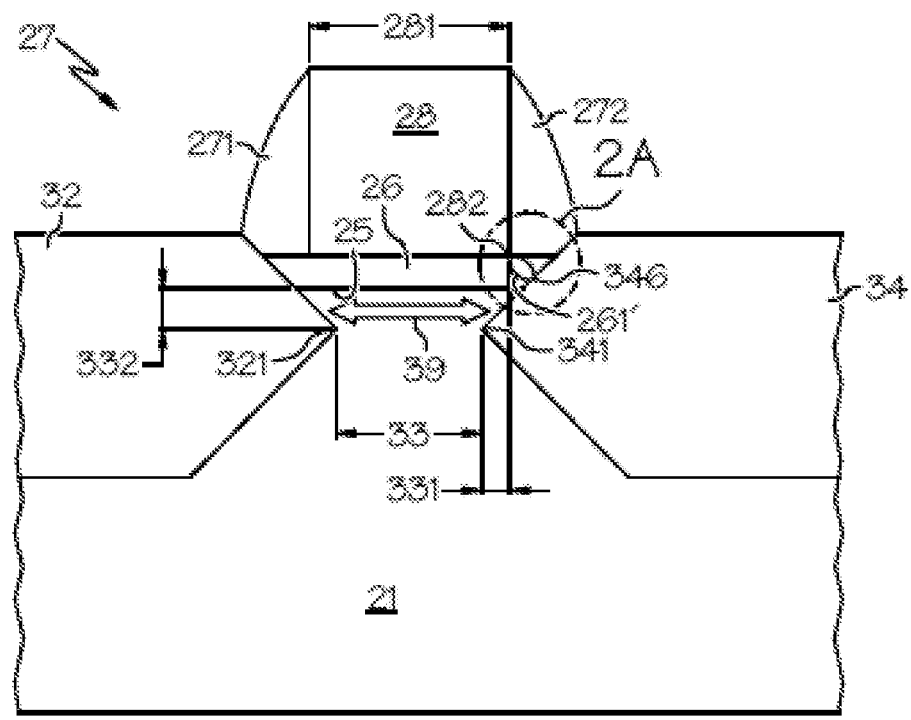
FIG. 2 shows a simplified cross-sectional view of a MOSFET employing strain inducing source-drain regions of a shape different than those shown in FIG. 1, also according to the prior art.
Figure 2A:
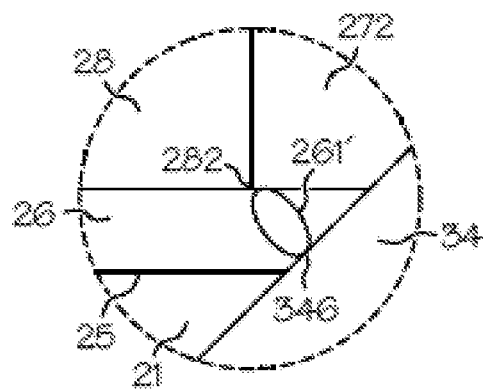
FIG. 2A shows a simplified cross-sectional view of a portion of the MOSFET of FIG. 2 somewhat enlarged to show more detail.

FIG. 2 shows a simplified cross-sectional view of MOSFET 40 employing strain inducing source-drain regions 32, 34 (e.g., of Si—Ge and/or Si—C) but of a shape different than those shown in FIG. 1, also according to the prior art. FIG. 2A shows a simplified cross-sectional view of a portion of MOSFET 40 of FIG. 2 somewhat enlarged to show more detail. FIGS. 2 and 2A are discussed together. MOSFET 40 includes substrate 21 (e.g., of silicon) having upper surface 25. Strain inducing source and drain regions 32, 34 spaced apart by distance 33, have been formed in substrate 21 extending substantially to surface 25. Overlying surface 25 of substrate 21 between source 32 and drain 34 is gate insulator or dielectric 26 (e.g., of silicon oxide). Overlying gate insulator 26 is conductive gate 28 of lateral width 281. Dielectric sidewall regions 271, 272 (collectively 27) are provided on lateral edges of gate 28. When gate 28 is appropriately biased with respect to source region 32 and drain region 34, conductive channel region 39 is induced between source region 32 and drain region 34. For a PMOS device, substrate 21 is N-type and source-drain regions 32, 34 are P-type and channel region 39 embodies conduction by holes. For an NMOS device, substrate 21 is P-type and source-drain regions 32, 34 are N-type and channel region 39 embodies conduction by electrons.

As before, the use of, for example, Si—Ge and/or Si—C source-drain regions 32, 34 introduces significant strain in channel region 39, thereby enhancing the carrier mobility therein and improving the device properties. Device 40 of FIGS. 2 and 2A differs from device 20 of FIG. 1 in that source-drain regions 32, 34 are formed in such a way as to have nose regions 321, 341 located beneath SC surface 25 by amount 332 and extending laterally toward each other underlying gate 28. Thus, source-drain separation 33 of device 40 of FIG. 2 can be made smaller than source-drain separation 23 of device 20 of FIG. 1. Stated another way, while drain edge 246 in device 20 of FIG. 1 is to the right of gate edge 282 by lateral distance or amount 231 in device 20 of FIG. 1, nose region 341 of device 40 of FIG. 2 is to the left of gate edge 282 by lateral distance or amount 331, that is, closer to source 32. As a consequence, the strain induced in channel region 39 is correspondingly enhanced, thereby further improving carrier mobility therein and device properties.

However, the reduction in source-drains pacing 39 that can be achieved is limited by the reduction in the width of high field region 261' (see FIG. 2A) between gate edge 282 and drain edge 346 (i.e., the closest portion of drain region 34) where gate-drain breakdown is most likely to occur. Thus, while some improvement in channel carrier mobility can be achieved with the structure of device 40 of FIGS. 2 and 2A compared to device 20 of FIG. 1, the improvement is less than desired because of geometric factors inherent in the structure of device 40 of FIGS. 2 and 2A that limit the reduction in source-drain spacing 33 that can be achieved without adverse effect on other device properties, e.g., on gate-drain breakdown voltage or leakage.

Figure 3:
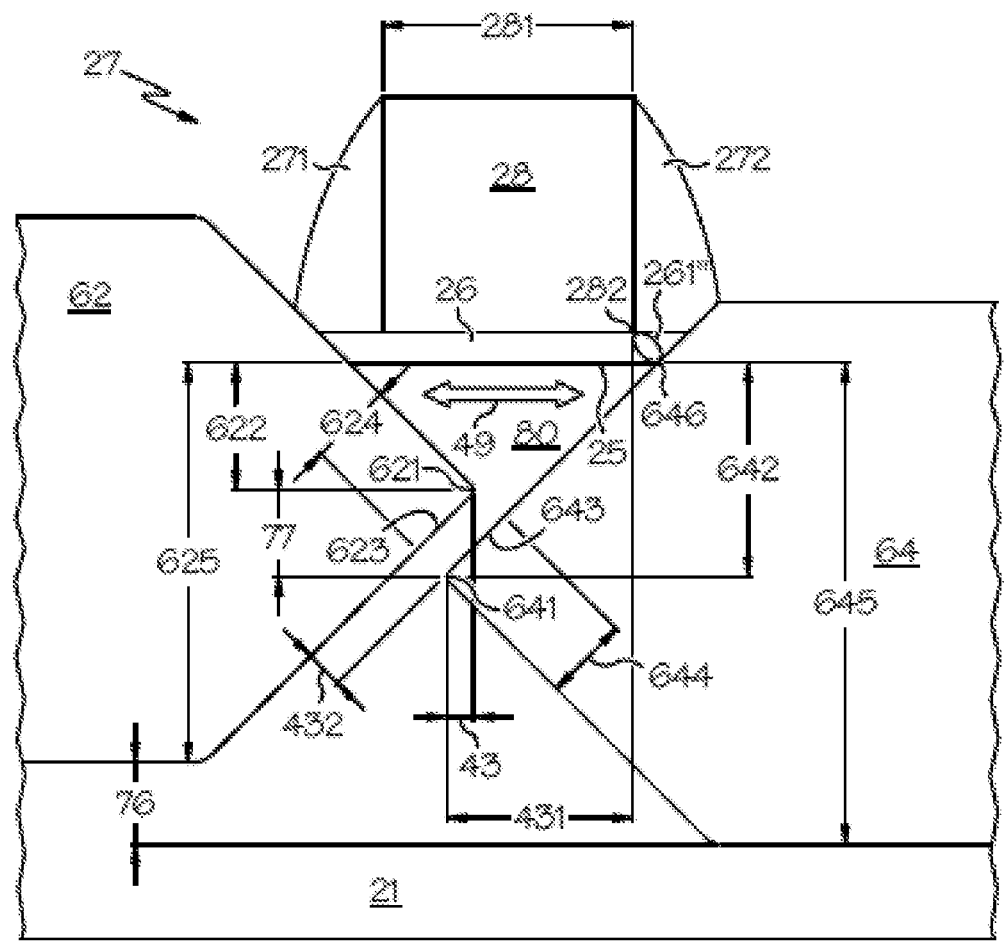
FIG. 3 shows a simplified cross-sectional view of a MOSFET employing strain inducing source-drain regions of a shape and location different than those shown in FIGS. 1 and 2, according to an embodiment of the invention.
Figure 4:
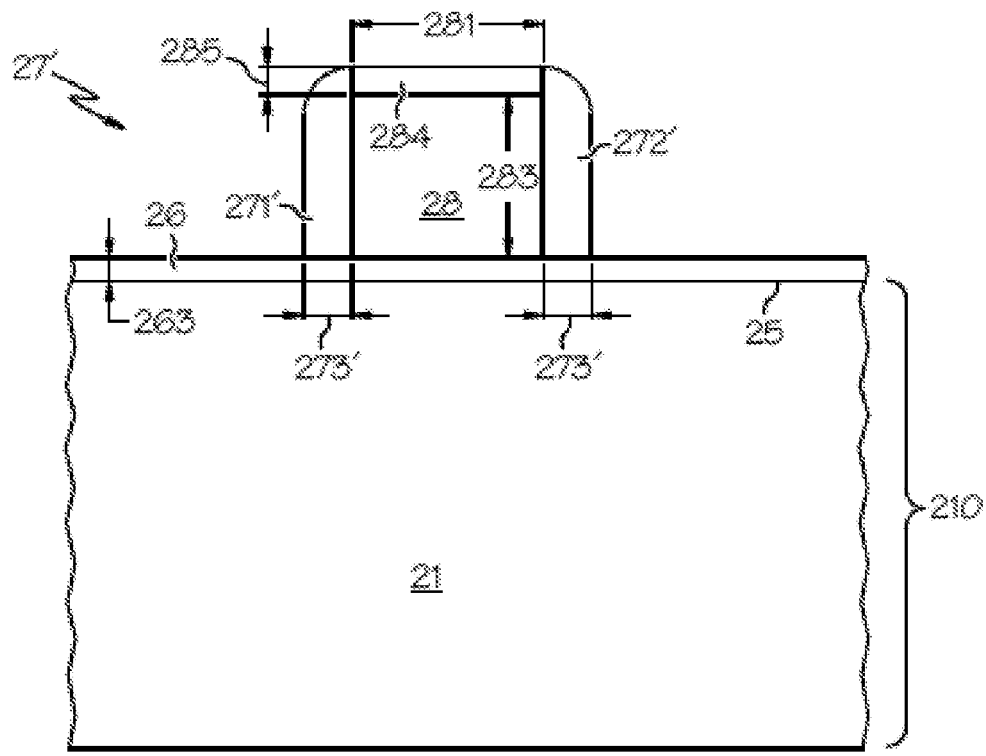
FIGS. 4-12 show simplified cross-sectional views of the MOSFET of FIG. 3 during various stages of manufacture, according to further embodiments of the invention.

FIG. 3 shows a simplified cross-sectional view of MOSFET 60 employing strain inducing source-drain regions 62, 64 of a shape and location different than those shown in FIGS. 1 and 2, according to an embodiment of the invention. In FIGS. 3-12, region 62 is typically identified as the "source" of MOSFET 60 and region 64 as the "drain" of MOSFET 60 and the cavities in which they are formed may also be referred to as "source cavity 62" or "drain cavity 64", but this is merely for convenience of explanation and not intended to be limiting. Persons of skill in the art will understand that the designations of "source" and "drain" may be interchanged and that region 64 may function as a "source" and region 62 as a "drain" and vice-versa. Accordingly, reference to doped region 62 and associated cavity 62", 62' as a "source" and reference to doped region 64 and associated cavity 64", 64' as a "drain" are used merely for convenience of description and not intended to limit these regions to such singular functions since they may perform either source or drain functions depending on how MOSFET 60 is used.

MOSFET 60 of FIG. 3 includes substrate 21 (e.g., of silicon) having upper surface 25 in which have been formed source-drain regions 62, 64 extending vertically substantially to or above surface 25. Strain inducing source region 62 of depth 625 from surface 25 has nose region 621 at depth 622 from surface 25. Drain region 64 (e.g. of Si—Ge and/or Si—C) of depth 645 from surface 25 has nose region 641 at depth 642 from surface 25. Nose regions 621, 641 are laterally spaced by distance 43 and vertically separated by distance 77. Overlying surface 25 of substrate 21 between source region 62 and drain region 64 is gate insulator or dielectric 26 (e.g., of silicon oxide). Overlying gate insulator 26 is conductive gate 28 of lateral width 281. The terms "gate" and "control gate" are used interchangeably herein. Dielectric sidewall regions 271, 272 (collectively 27) are provided on lateral edges of gate 28. In device 60 of FIG. 3, nose region 621 of source region 62 and nose region 641 of drain region 64 can laterally overlap by amount 43, that is, nose region 641 can extend to the left and below nose region 621. While this is desirable, it is not essential. Nose region 641 also extends to the left of gate edge 282 by distance 431. Substantially parallel surfaces 623, 643 of widths 624, 644 respectively in the plane of FIG. 3 of source and drain regions 62, 64 face each other across substantially uniform gap of width 432. When gate 28 is appropriately biased with respect to source region 62 and drain region 64, conductive channel region 49 is induced between source region 62 and drain region 64. For a PMOS device, substrate 21 is N-type and source-drain regions 62, 64 are P-type and induced channel region 49 embodies conduction by holes. For an NMOS device, substrate 21 is P-type and source-drain regions 62, 64 are N-type and induced channel region 49 embodies conduction by electrons.

It has been discovered that more favorable strain inducing source-drain geometry can be obtained by forming source-drain regions 62, 64 so that relative depths 622, 642 of nose regions 621, 641 can be independently controlled. Such device geometry is illustrated by MOSFET 60 of FIG. 3 wherein nose region 641 underlies nose region 621 rather than be facing each other at the same level as in device 40 of FIG. 2. When nose regions 621, 641 laterally overlap, a device geometry that is much more favorable for strain induce mobility enhancement in device channel region 49 is achieved. This is because a larger volume of strain inducing material of source-drain regions 62, 64 is brought into closer proximity to portion 80 of device 60 of FIG. 3, bounded by source-drain 62, 64 and dielectric 26 underlying gate 28, where channel region 49 is located, than is possible with the arrangements of FIGS. 1-2. Thus, the channel mobility enhancement effect is larger in device 60 than in prior art devices 20 and 40. This is a significant advance in the art and of great practical value.

FIGS. 4-12 show simplified cross-sectional views of MOSFET 60 of FIG. 3 during various stages of manufacture 504-512, according to further embodiments of the invention. Referring now to manufacturing stage 504 of FIG. 4, SC containing substrate 21 of thickness 210 is provided having surface 25. For reasons to be explained later, surface 25 desirably corresponds to a [100] crystalline plane. Thickness 210 is generally determined by manufacturing convenience, e.g., what size wafers are being used, etc., and the choice thereof is within the competence of those of skill in the art. Dielectric layer 26 (e.g., of silicon oxide) is formed on surface 25 and gate conductor 28 of lateral width 281 and height 283 is formed over dielectric layer 26. Gate dielectric 26 is typically of the order of about 1 to 1.5 nanometers in thickness, although thicker and thinner layers can also be used. In a preferred embodiment, width 281 of gate 28 is desirably in the range of about 20 to 30 nanometers and height 283 is desirably in the range of about 50 to 70 nanometers, but larger and smaller dimensions may also be used. The portion of dielectric layer 26 lying between gate conductor 28 and surface 25 serves as the gate insulator of MOSFET 60, and is hereafter also identified by reference number 26.

For manufacturing convenience, gate 28 desirably has lateral dielectric sidewalls 271', 272' (collectively side-wall spacers 27') of lateral width 273' and has overlying dielectric layer 284 of thickness 285. In a preferred embodiment, width 273' is desirably in the range of about 3 to 5 nanometers and thickness 285 is desirably in the range of about 3 to 5 nanometers, but larger and smaller dimensions may also be used. Silicon nitride is a non-limiting example of a suitable material for dielectric regions or layers 271', 272', 284, but other dielectric materials may also be used. Structure 604 results. As will become apparent from subsequent figures, side-wall spacers 27' determine the lateral separation of the source-drain regions 62, 64 from gate 28. Side-wall spacers 27' are also helpful in avoiding attacking the lateral edges of gate dielectric 26 during cavity etching performed in connection with FIGS. 6-9. Another purpose of dielectric spacers 27' (and dielectric cap 284) is to protect gate 28 from epitaxial growth of the material used to form source-drains 62, 64, which desirably only forms on the portions of substrate 21 exposed in cavities 62', 64' subsequently etched into substrate 21 (e.g., see FIGS. 6-9). The proximity of source-drain regions 62, 64 determines the amount of stress in channel region 49 of transistor 60. The closer the proximity of source-drain regions 62, 64, the greater the stress induced in channel region 49, but reliability issues can arise if gate dielectric 26 is attacked during cavity etching. Providing sidewall spacers 27' allows these conflicting requirements to be appropriately balanced, as is discussed in more detail in connection with FIG. 12A hereafter.

Figure 5:
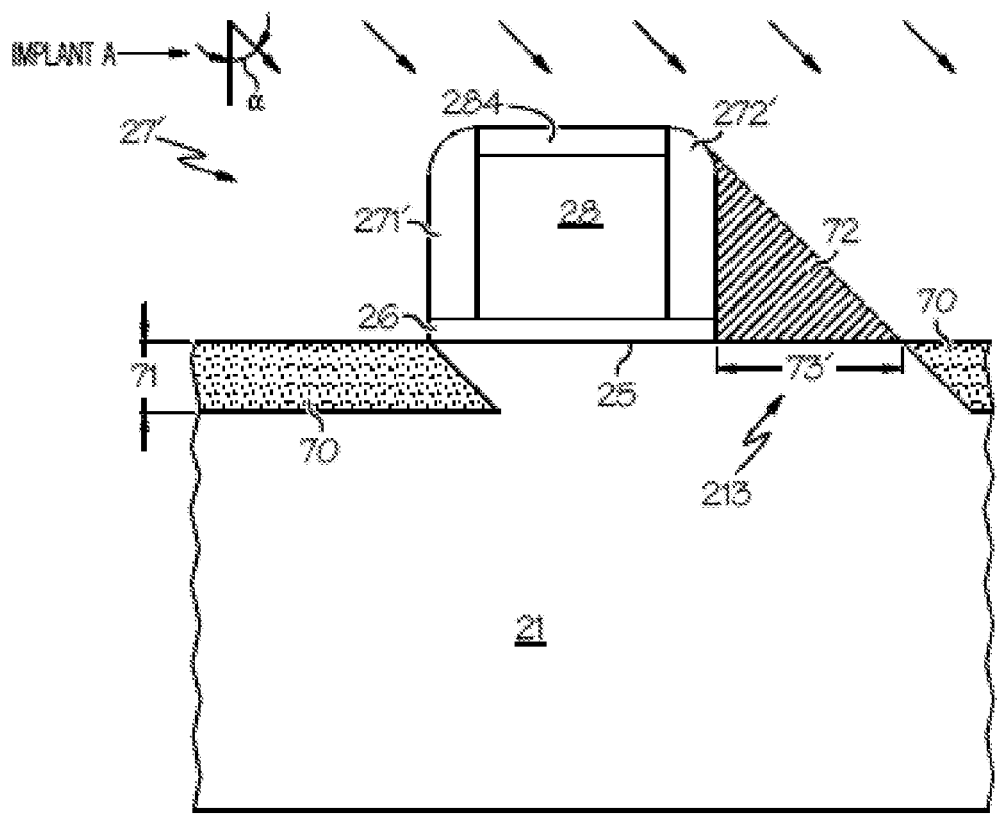

Referring now to manufacturing stage 505 of FIG. 5, structure 604 is desirably but not essentially subjected to Implant A at angle α, where 0<α<90 degrees. Implant A is an amorphization implant, that is, intended to convert region 70 of depth 71 proximate surface 52 of substrate 21 from a crystalline to an amorphous state. Ge, Xe, Si and combinations thereof are non-limiting examples of useful implant ions or materials for Implant A, but other materials may also be used. Ge is preferred for Implant A. Implant energy and dose are chosen dependent upon desired depth 71, the desired degree of amorphization and the material of substrate 21. A non-limiting example using Ge for Implant A intended to amorphize region 70 of thickness 71 of about 20 nanometers in substrate 21 of, e.g., silicon, is a dose of about 5E14 ions per $cm^2$ at an energy of about 20 kEV, but higher and lower doses and energies may also be used. Amorphized region 70 is intended to act as a localized etch mask during manufacturing stage 506 of FIG. 6, and depth 71 is chosen with that function in mind, the greater the etch rate differentiation exhibited by region 70, the shallower depth 71 may be. Implant A is provided at angle α with respect to the normal to surface 25. By way of example and not limitation, angle α is desirably in the range of about 20≤α≤40 degrees, but other angles may also be used. As a consequence of angle α, gate 28 and associated dielectric regions 272', 284 provide shadow region 72 proximate sidewall 272' of gate 28 over portion 213 of substrate 21 of lateral width 73'. No amorphizing implant is received by substrate 21 in substrate portion 213 of width 73' underneath shadow region 72. By way of example and not limitation, lateral width 73' is usefully in the range of about 10 to 20 nanometers, but larger and smaller widths may also be used. Structure 605 results.

Figure 6:
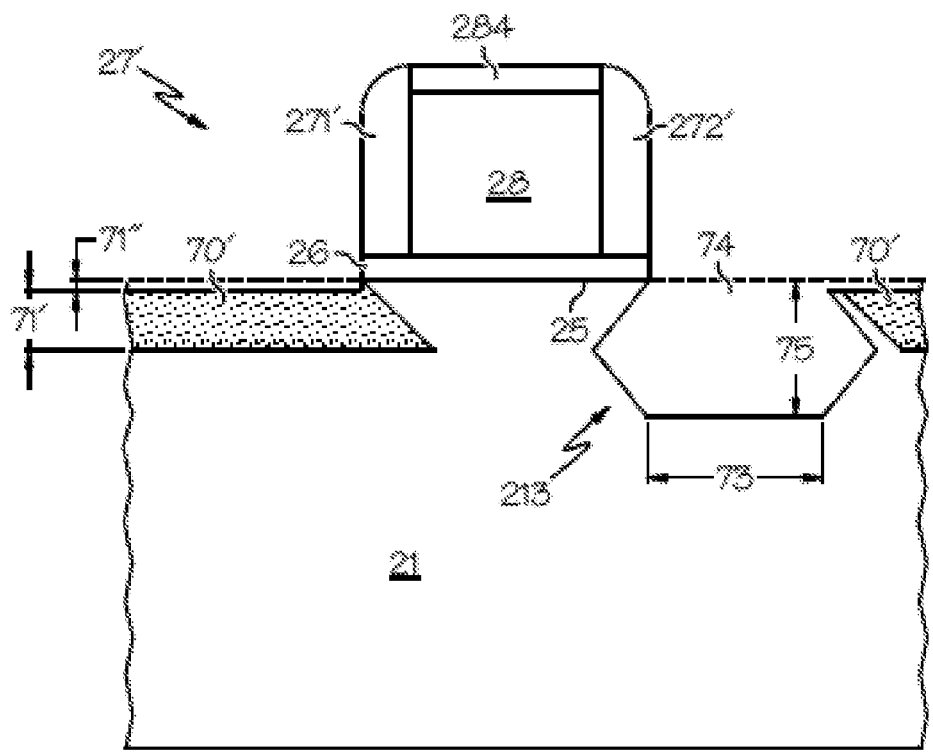

Referring now to manufacturing stage 506 of FIG. 6, structure 605 is subjected to an etch to form cavity 74 of depth 75 and width 73 corresponding approximately to width 73' of shadow region 72 of FIG. 5. The etchant used to form cavity 74 should preferentially attack crystalline SC material, especially single crystal material, more rapidly than amorphous SC material. It is known that certain reagents etch more rapidly along predetermined crystalline directions than along random (e.g., amorphized) crystalline directions. For silicon substrates, tetra-methyl ammonium hydroxide (TMAH) is a suitable etchant that attacks crystalline silicon more rapidly than amorphous silicon, for example by as much as 20 to 100 times more rapidly, but other etchants can also be used depending upon the material of substrate 21. It has been found that TMAH concentrations in the range of about 5-25 weight percent in water and etch temperatures in the range of about 60 to 90 degrees Celsius are useful, but other concentrations and temperatures may also be used. Etch times will vary depending on depth 75 desired for cavity 74. For cavity depths 75 in the range of about 20 to 40 nanometers, etch times in the range of about 15 to 25 seconds are useful, but larger and smaller etch times may also be used, depending on the concentrations chosen and desired depth 75. Some small erosion of region 70 of FIG. 5 may occur during etching of cavity 74 illustrated in FIG. 6. For example, depth 71" in the range of 1 to 2 nanometers may be removed leaving region 70' of thickness 71' of FIG. 6 slightly thinner than region 70 of FIG. 5. Structure 606 results.

Figure 7:
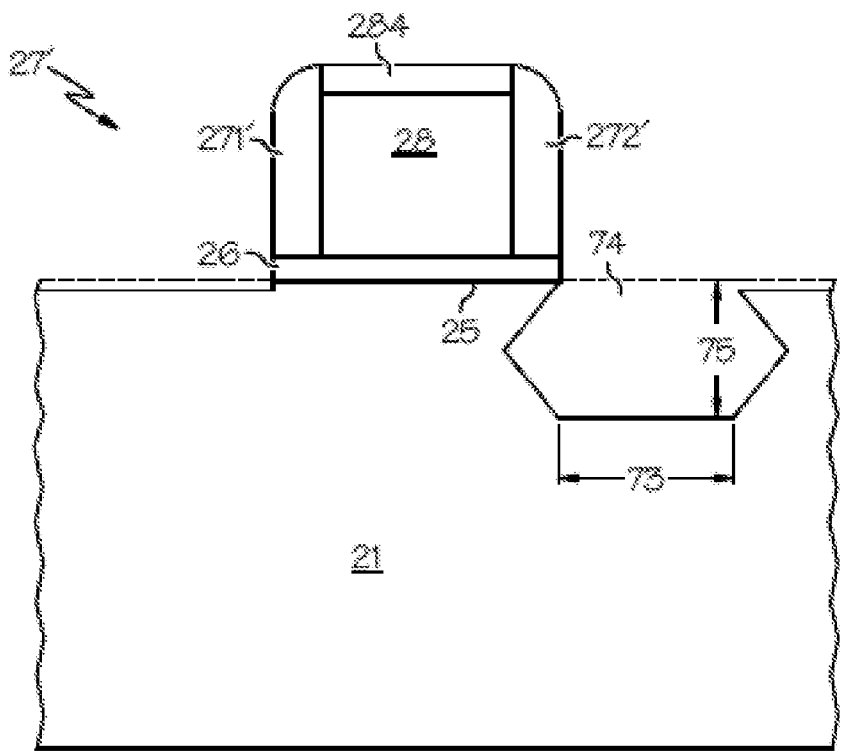

Referring now to manufacturing stage 507 of FIG. 7, structure 606 of FIG. 6 is desirably subjected to a thermal anneal to re-crystallize amorphous region 70' of FIG. 6. For silicon semiconductor, an anneal at temperatures in the range of about 1100 to 1200 degrees Celsius for about 1 to 10 milliseconds are suitable, but longer and shorter times and higher and lower temperatures may also be used, provided that the near surface region (e.g., region 70' of FIG. 6) of substrate 21 is returned substantially to a substantially crystalline state. Structure 607 results. While the procedure illustrated in FIGS. 5-7 is preferred since it requires no masking step, any mean s for forming structure 607 may be used. For example and not intended to be limiting, an etch mask (not shown) may be applied to structure 604 having an opening substantially of width 73' (see FIG. 5) located above portion 213 of surface 25 of substrate 21. Cavity 74 of depth 75 and lateral extent 73 is then etched in substrate 21 through that mask opening, using any convenient etch procedure. It is not necessary to use a crystallographic orientation sensitive etch such as described above and the lateral profile of initial cavity 74 may be similar to or different than what is illustrated in FIGS. 6-7, e.g., a straight sided, sloped sided, curved sided, etc., and such other shape cavities are substantially equivalent for initial cavity 74. Any convenient etch process may be used.

Figure 8:
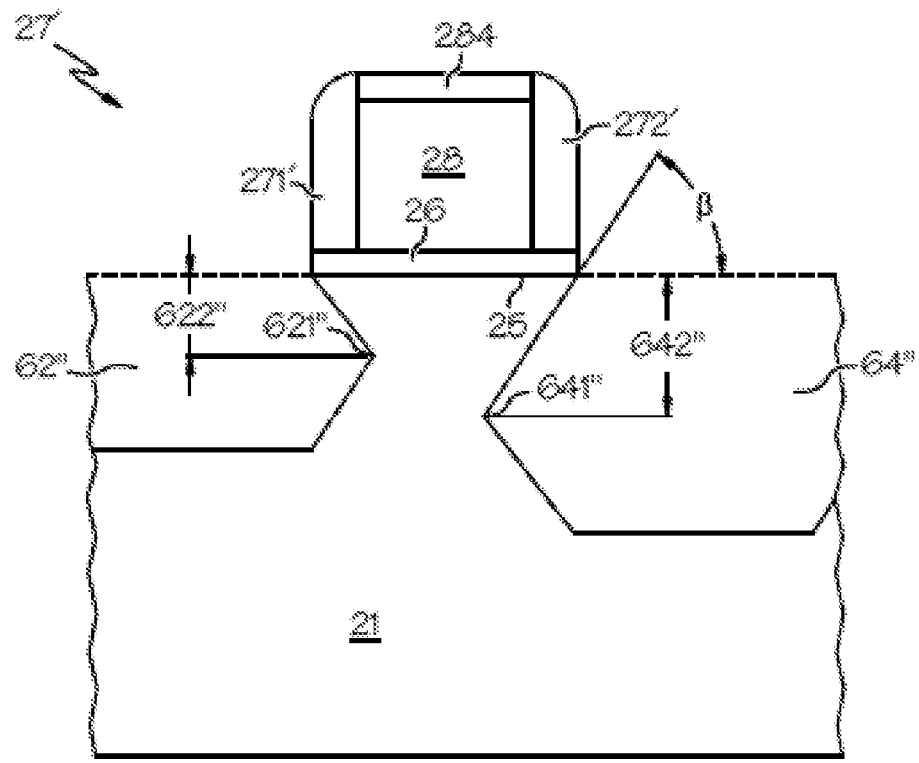
Figure 9:
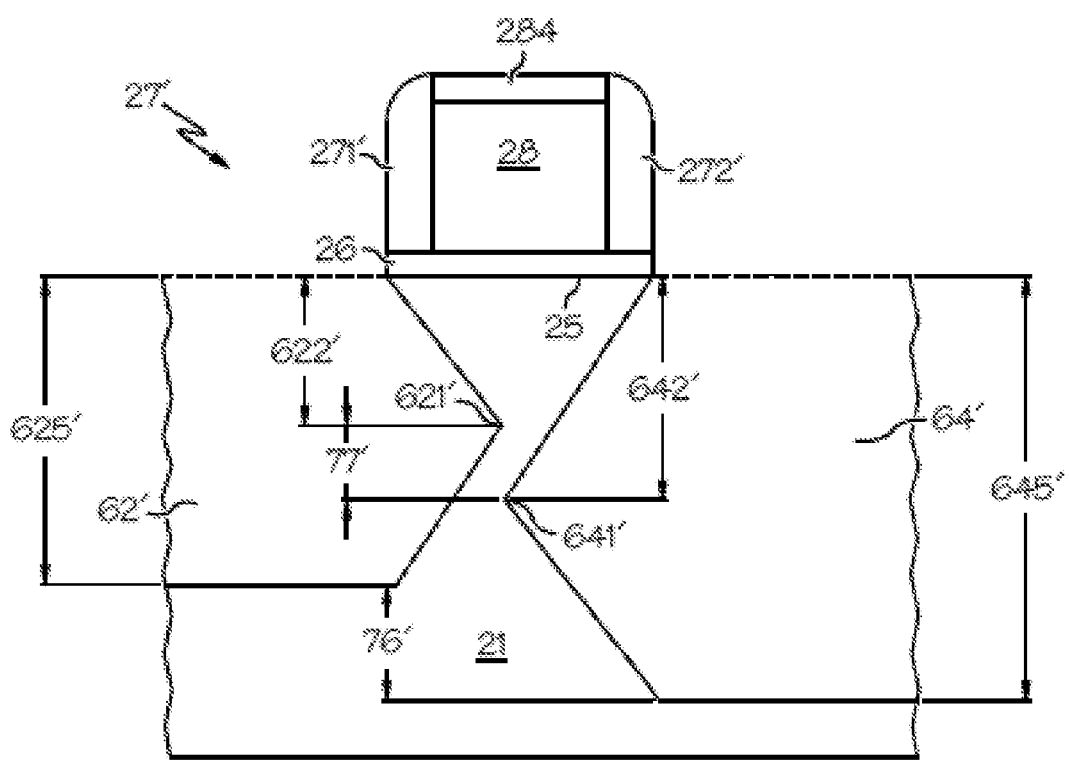

Referring now to manufacturing stage 508 of FIG. 8 and manufacturing stage 509 of FIG. 9 (which are discussed together), structure 607 (or equivalent) is subjected to a crystallographic sensitive etch to form cavities 62", 64" in FIG. 8 and cavities 62', 64' in FIG. 9. TMAH and KOH are non-limiting examples of orientation sensitive etches useful with silicon. TMAH is preferred. With [100] oriented silicon, etching proceeds for example, more rapidly along [110] crystallographic planes, at an angle β with respect to surface 25 of, for example, about 37.5°. For other substrate materials, orientations and etchants, other preferred directions of etching may be obtained. In a preferred embodiment, cavities 62", 62' and 64", 64' are formed at the same time, but this is not essential, and they may be formed independently by etching them separately using one or more additional masking steps. Structure 608 results from manufacturing stage 508. It is assumed hereafter that cavities 62", 62' and 64", 64' are etched at the same time and the slight difference in depths from surface 25 resulting from differential etching erosion of amorphous regions 70 during formation of preliminary cavity 74 is ignored in FIG. 8 and following.

FIG. 8 illustrates the etching process at a preliminary stage when it is partially complete and FIG. 9 illustrates the etching process at a later stage approaching that illustrated in FIG. 3. By comparing FIGS. 7-9, it can be seen that the crystallographic dependent etch gives rise to nose regions or portions 621", 641" of cavities 62", 64" in FIG. 8 and nose regions or portions 621'. 641' of cavities 62', 64' in FIG. 9 that approach each other as etching progresses. It will be further noted, that nose regions 621", 621' of cavity 62", 62' have depths 622", 622' below surface 25 of substrate 21 and that nose region 641", 641' of cavity 64", 64' have depths 642", 642' below surface 25 of substrate 21, and that depths 622", 622' and 642", 642' increase as etching progresses. It will be noted that depths 622", 622' are always shallower than depths 642", 642'. In this way, when etching is carried out for a sufficient time, nose region 641' can underlie nose region 621', leading to the structure illustrated in FIGS. 9 and 3. This favorable geometry arises because of the formation of initial cavity 74 only on one sidewall of gate 28. In the foregoing examples, initial cavity 74 is formed on the side corresponding to the location of cavity 64", 64', but in other embodiments, initial cavity 74 may be formed elsewhere. By having one of cavities 62", 62' and 64", 64' start substantially from surface 25 and the other of cavities 62", 62' and 64", 64' start from initial cavity 74, the asymmetry of depths 622", 622' and 642", 642' of nose portions 621", 621' and 641", 641' is assured and the resulting favorable MOSFET geometry illustrated in FIG. 3 can be obtained. Structure 609 results.

For silicon, TMAH is a suitable etchant for forming cavities 62", 64" and 62', 64', although other orientation sensitive etchants can also be used. For the etching illustrated in FIGS. 8-9, it has been found that TMAH concentrations in the range of about 5-25 weight percent in water and etch temperatures in the range of about 60 to 90 degrees Celsius are useful, but other concentrations and temperatures may also be used. Etch times will vary depending on the depths 625', 645' desired for cavities 62', 64'. In a preferred embodiment, where initial cavity 74 has depth 75 in the range of about 20 to 40 nanometers, then cavity 62' usefully has depth 625' in the range of about 40 to 60 nanometers and cavity 64' usefully has depth 645' in the range of about 60 to 80 nanometers, resulting in differential cavity depth 76' (see FIG. 9) in the range of about 15 to 35 nanometers. Depth 622' of nose 621' is usefully about 20 to 30 nanometers and depth 642' of nose 641' is usefully about 30 to 40 nanometers, with difference amount 77' of about 8 to 20 nanometers, but larger and smaller depths and difference amounts can also be used. TMAH etch times in the range of about 30 to 60 seconds at about 35 to 60 degrees Celsius are useful, but larger and smaller etch times and temperatures may also be used, depending on the concentrations chosen and the desired depths or depth differentials. Structure 609 results. By adjusting depth 75 of initial cavity 74 and etch times of subsequent cavities 62', 64', the desired degree of proximity and/or overlap of nose portions 621', 641' of cavities 62', 64' and nose portions 621, 641 of subsequent epi regions 62, 64 of FIGS. 3 and 10-12 grown in cavities 62', 64', are obtained. This is very useful in optimizing the properties of MOSFET 60 and is a significant advance in the state of the art.

Figure 10:
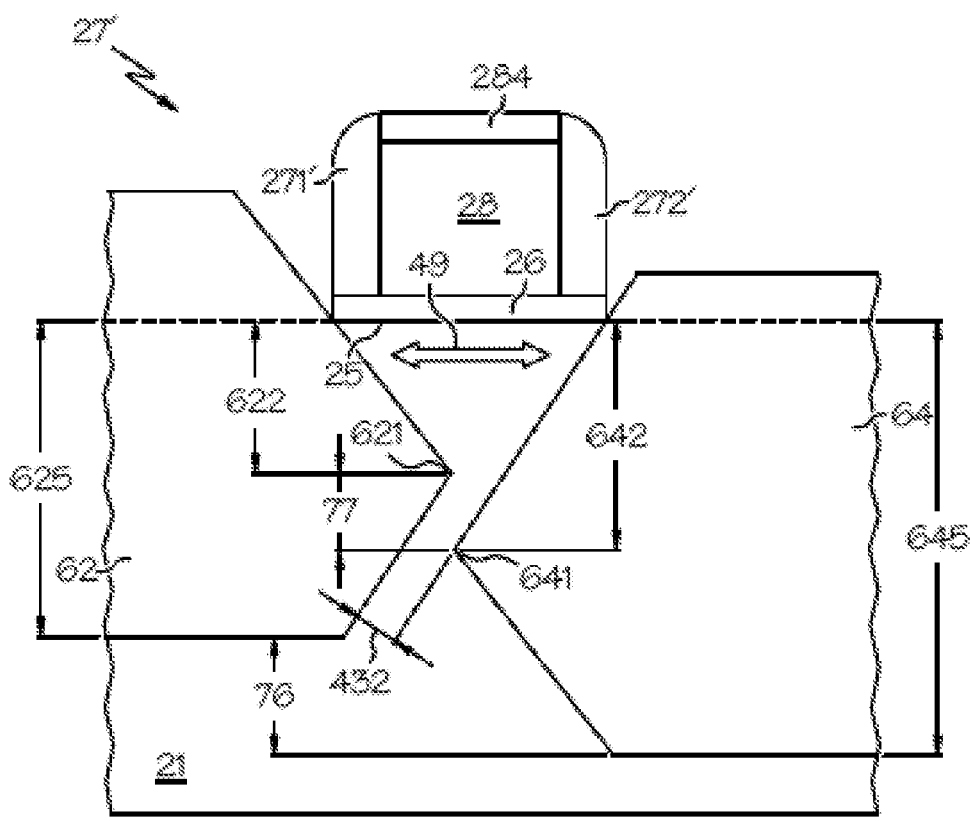

Referring now to manufacturing stage 510 of FIG. 10, cavities 62', 64' of structure 609 are refilled with semiconductor material, for example by selective epitaxial growth, thereby providing source-drain regions 62, 64 having facing nose regions 621, 641 at depths 622, 642 respectively below surface 25 of substrate 21, with nose depth differential 77 and overall depth differential 76. Source-drain regions 62, 64 are preferably refilled at the same time and in-situ doped during formation to have the desired impurity concentrations suitable for their function as the source-drain regions of MOSFET 60. In other embodiments, they may be filled separately and/or with the same or different semiconductor materials. For example and not intended to be limiting, cavities 62', 64 may be filled with semiconductor materials having the same or different lattice constants. In order to induce strain in region 80 containing channel region 49, only one of cavities 62', 64' need be filled with a material having a lattice constant different than that of substrate 21 in region 80. However, in a preferred embodiment, both are filled with such material since a greater strain inducing effect can be therefore obtained. In a still further embodiment, cavities 62', 64' may be filled with semiconductor materials having lattice constants different from each other as well as different from that of substrate 21 in region 80. All such variations are useful.

Because cavities 62', 64' have different depths 625', 645' beneath surface 25 (see FIG. 9), re-grown epi-regions 62, 64 have depths 625, 645 beneath surface 25 and overall depth differential 76. When formed at the same time, re-grown epi-region 62 will generally extend above surface 25 a greater distance than region 64, and re-grown epi-region 64 will extend to a greater depth beneath surface 25 than region 62, but this is not essential. Epi re-growth is performed, for example, using low pressure chemical vapor deposition (LPCVD) epitaxy (e.g., for Si—Ge epitaxy) or ultra-high vacuum epitaxy (e.g., for Si—C epitaxy), according to means well known in the art, but other epitaxial growth procedures may also be used. By way of example and not intended to be limiting, SiGe may be epitaxially formed using chemical vapor deposition (CVD) at pressures in the range of about 30 to 250 Pascal and temperatures in the range of about 650 to 750 degrees Celsius, with source gases of $SiH_4$ or $Si_2Cl_2H_2$, $B_2H_2$ and $GeH_4$, but other pressures, temperatures and source gases may also be used. By way of example and not intended to be limiting, SiC may be epitaxially formed using high vacuum CVD at pressures less than or equal about $10^{-6}$ Pascal and temperatures in the range of about 550 to 650 degrees Celsius, with source gases of $Si_2H_6$ and $SiH_3CH_3$, but other pressures, temperatures and source gases may also be used.

One of the advantages of the structure of MOSFET 60 is that, the carrier mobility in induced channel region 49 (see FIGS. 3 and 10-12) may be enhanced by re-filling one or both of cavities 62', 64' with strain inducing semiconductor material for source-drain region 62, 64, as for example with semiconductor material(s) having different lattice constant(s) than that of substrate 21. For PMOS devices in silicon Si—Ge is useful, and for NMOS devices in silicon Si—C is useful, as the strain inducing materials, but other materials may also be used for silicon and in conjunction with other substrate materials. For example, source-drain regions of Si—Ge may be formed for PMOS devices and source-drain regions of Si—C may be formed for NMOS devices. Dielectric sidewalls 271', 272' and dielectric overlayer 284 inhibit epi growth on gate 28 during formation of source-drain regions 62, 64. This is a great manufacturing convenience. Structure 610 results.

Figure 11:
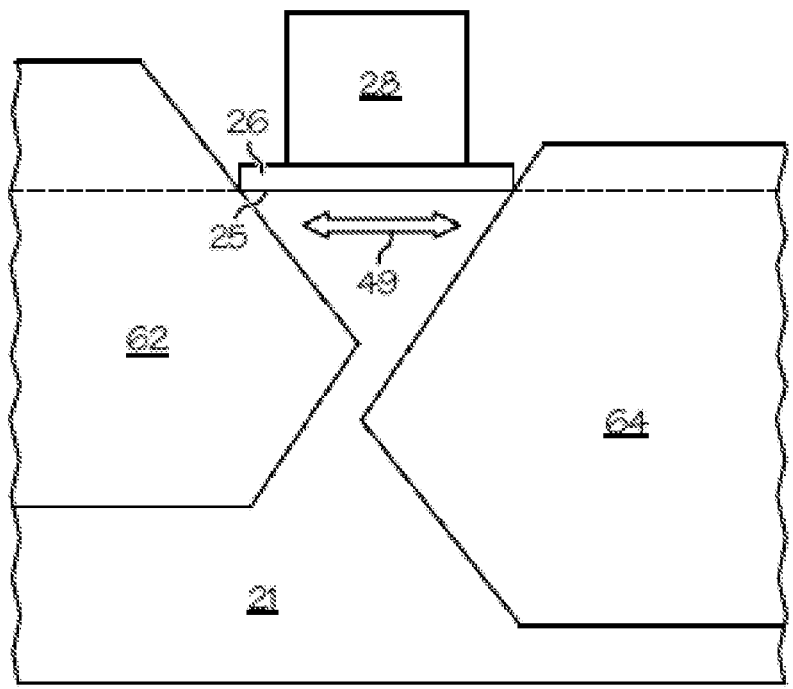

Referring now to manufacturing stage 511 of FIG. 11, structure 610 is desirably differentially etched to remove dielectric sidewalls 271', 272' and overlayer 284 using means well known in the art. Structure 611 results. Referring now to manufacturing stage 512 of FIG. 12, structure 611 desirably but not essentially, has dielectric sidewalls 271, 272 (e.g., of silicon nitride), collectively sidewalls 27, formed on gate 28 using means well known in the art. Metal-SC alloy contacts (not shown) are desirably but not essentially formed, respectively, on epi-region (e.g., source), 62, epi-region (e.g., drain) 64 and gate 28, to provide low resistance Ohmic contact thereto. Means for forming such metal-SC alloy contacts on exposed SC regions (e.g., region 62, 64) and exposed gate conductor 28 but not on dielectric sidewall regions 271, 272 are well known in the art. Substantially finished structure 612 results. Further interconnections and dielectric interlayers may be provided using conventional "back-end" operations well known in the art, but are not essential.

Figure 12:
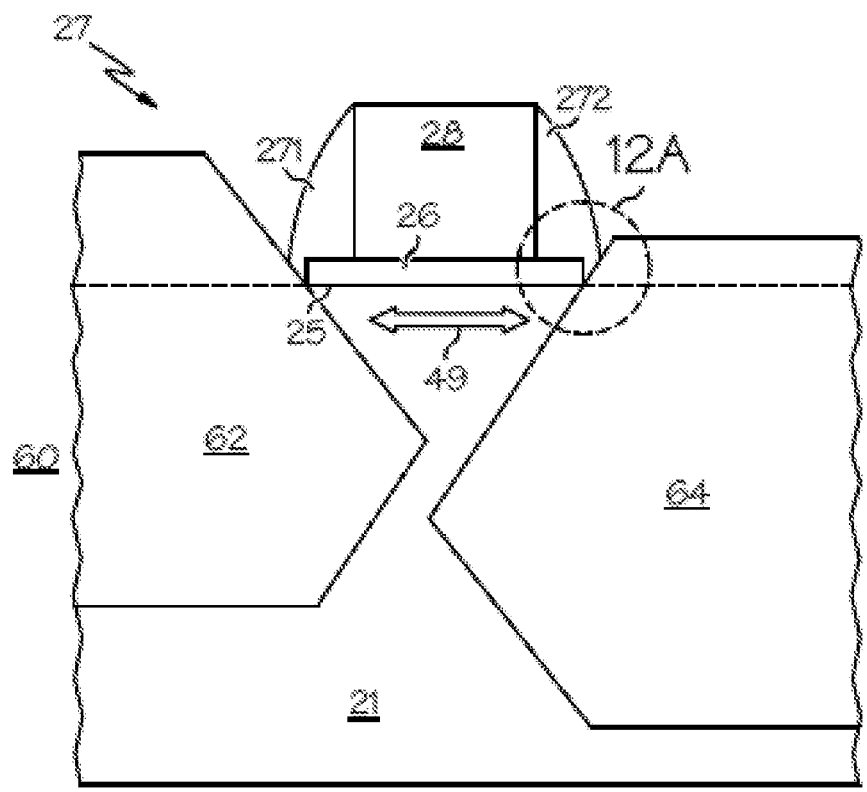
Figure 12A:
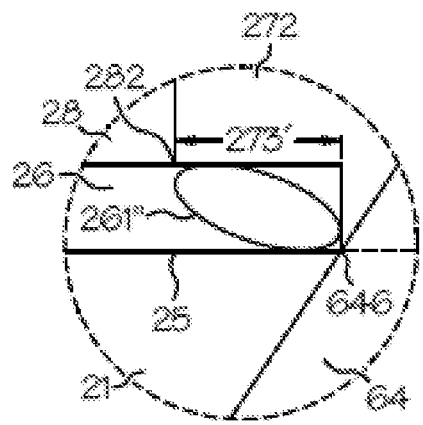
FIG. 12A shows a simplified cross-sectional view of a portion of the MOSFET of FIG. 12 somewhat enlarged to show more detail.

FIG. 12A shows a simplified cross-sectional view of a portion of MOSFET 60 of FIG. 12 somewhat enlarged to show more detail of edge 282 of gate 28 proximate drain region 64. Gate edge 282 is separated from closest point 646 of drain 64 by region 261" of gate dielectric 26. During operation of device 60, region 261" can be subject to high electric fields. As noted in connection with prior art device 40 of FIGS. 2 and 2A, analogous high field region 261' of FIGS. 2 and 2A may be adversely affected by the structure of device 40 of FIGS. 2 and 2A, thereby resulting in premature breakdown and lower manufacturing yields. This problem is mitigated or avoided with device 60 of FIGS. 3-12, as is illustrated in connection with FIG. 12A. The lateral size of (e.g., high field) portion 261" of gate dielectric 26 between gate edge 282 and closest drain portion 646 is determined by width 273' of sidewall 272' formed in connection with manufacturing stage 504 of FIG. 4. For the same applied voltage, the greater width 273', the lower the electric field appearing across gate portion 261" and the less the risk of premature gate-drain breakdown and manufacturing yield loss resulting therefrom. It will be noted in connection with FIGS. 4-12, that width 273' of initial sidewalls 271', 272' has little impact upon formation of source drain regions 62, 64. If increasing width 273' of initial sidewalls 271', 272' increases the separation of nose portions 621', 642' of cavities 62', 64' by a corresponding amount, this is compensated for by providing a slight increase in etch time for forming cavities 62', 64'. Thus, width 273' may be increased to provide a larger gate-drain breakdown voltage margin with little or no impact upon the other properties of device 60. This is a further advantage of device 60 and associated manufacturing method, and provides not only devices with greater channel mobility enhancement than can be obtained with prior art devices 20, 40 of FIGS. 1-2, but provides devices with overall more robust properties. This is a significant and desirable advance in the art.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described and in methods of preparation in an exemplary embodiment without departing from the scope of the invention as set forth in the appended claims and their legal equivalents.

What is claimed is:

1. A MOSFET comprising:
   a semiconductor containing substrate having a first surface;
   a gate overlying the first surface and insulated therefrom;
   a source region laterally located proximate a first side of the gate, extending into the substrate from the first surface and having a first portion extending under the gate at a first depth from the first surface; and
   a drain region laterally located proximate a second side of the gate, extending into the substrate from the first surface and having a second portion extending under the gate toward the first portion at a second depth from the first surface different than the first depth, wherein the source region and the drain region laterally overlap.

2. The MOSFET of claim 1, wherein one or both of the source region and the drain region comprise a semiconductor material adapted to induce strain in an induced channel region between the source region and the drain region.

3. The MOSFET of claim 1, wherein one or both of the source and drain regions comprise an epitaxial semiconductor material having a lattice constant different from a lattice constant of the substrate between the source and drain regions.

4. The MOSFET of claim 1, wherein the substrate comprises silicon and the source and drain regions comprise silicon-germanium or silicon-carbon containing material.

5. The MOSFET of claim 1, wherein the source region has a first depth from the surface and the drain region has a second depth from the surface different than the first depth.

6. The MOSFET of claim 1, wherein the first portion of the source region and the second portion of the drain region extend toward each other under the gate without touching.

* * * * *